United States Patent [19]

Swanson, Jr.

[11] Patent Number: 4,881,050
[45] Date of Patent: Nov. 14, 1989

[54] THIN-FILM MICROWAVE FILTER
[75] Inventor: Daniel G. Swanson, Jr., Mountain View, Calif.
[73] Assignee: Avantek, Inc., Milpitas, Calif.
[21] Appl. No.: 228,288
[22] Filed: Aug. 4, 1988
[51] Int. Cl.⁴ .............................................. H03H 7/00
[52] U.S. Cl. .................................. 333/185; 333/168; 333/184; 361/328
[58] Field of Search ................. 333/167, 12, 181, 184, 333/185, 168, 204, 172; 361/328–330

[56] References Cited
U.S. PATENT DOCUMENTS

| | | | |
|---|---|---|---|
| 2,751,558 | 6/1956 | Grieg et al. | 333/204 |
| 4,188,594 | 2/1980 | Bongianni | 332/16 R |
| 4,329,779 | 5/1982 | England | 29/840 |
| 4,429,289 | 1/1984 | Higgins et al. | 333/204 |
| 4,455,540 | 6/1984 | Henriot et al. | 333/202 |
| 4,476,518 | 10/1984 | Tsukahara | 361/328 |
| 4,488,130 | 12/1984 | Young et al. | 333/203 |
| 4,489,292 | 12/1984 | Ogawa | 333/202 |
| 4,551,696 | 11/1985 | Choi et al. | 333/204 |

Primary Examiner—Eugene R. Laroche
Assistant Examiner—Seung Ham
Attorney, Agent, or Firm—Limbach, Limbach, & Sutton

[57] ABSTRACT

A thin-film, lumped element filter utilizing spiral inductors and capacitive pi networks is disclosed. The filter is fabricated from a planar dielectric substrate having a ground plane on one side thereof and two thin-film metal layers and an insulation layer disposed therebetween on the opposite side of the dielectric substrate. The metal and insulation layers are configured to form one or more capacitive pi networks and spiral inductors, which are electrically interconnected to form the filter.

8 Claims, 3 Drawing Sheets

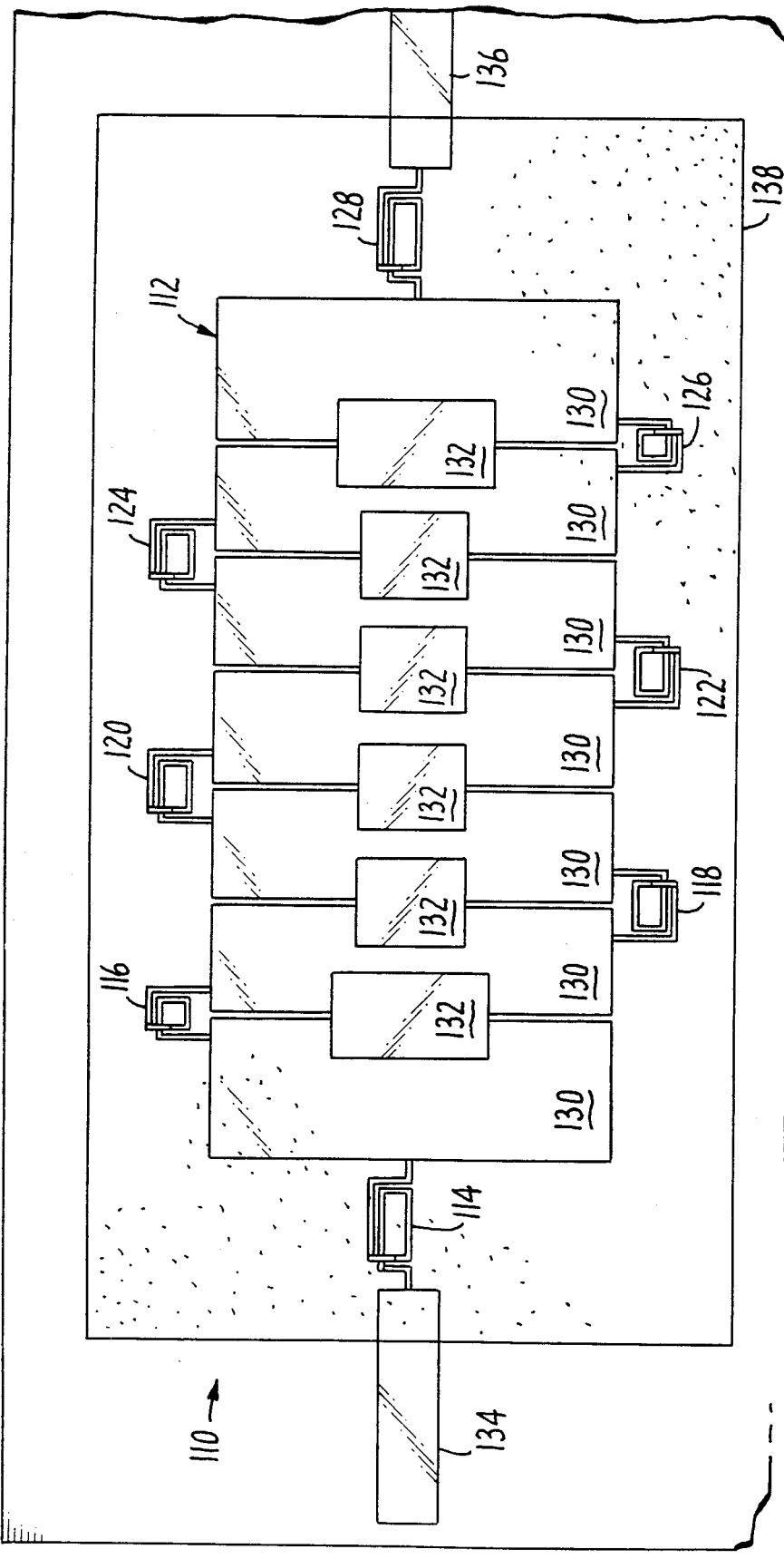
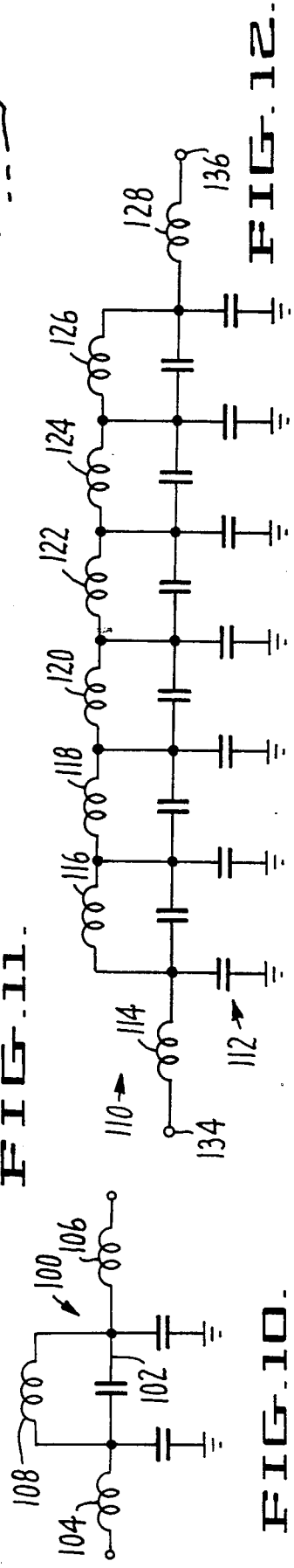
FIG. 11.
FIG. 12.
FIG. 10.

THIN-FILM MICROWAVE FILTER

BACKGROUND OF THE INVENTION

1. Field of the Invention

This invention relates generally to microwave frequency filters, and relates more particularly to filters utilizing thin-film lumped elements, including spiral inductors and capacitive pi networks.

2. Description of the Relevant Art

In the past, filters designed for operation in microwave frequency ranges, in excess of about 500 MHz, include designs such as discrete lumped element filters, mechanical distributed element filters, and printed distributed element filters. Discrete lumped element filters use separately fabricated air-wound inductors and parallel-plate capacitors that are wired together into a filter circuit. Discrete lumped element filters require significant amounts of hand labor to build and tune. The reliability of such filters is highly dependent on the skill and care taken by the assembler. The volume occupied by these kinds of filters is small but significant.

Mechanical distributed filters use coupled bars or rods to form transmission line networks which make a filter circuit. The length dimensions of the coupled bars or rods are typically one-quarter or one-half of the wave length at the center frequency of the filter. Mechanical distributed filters occupy a significant volume, particularly at lower microwave frequencies. Another disadvantage is that spurious responses, occurring at multiples of the center frequency, degrade the performance of the filter in the stop band.

Printed distributed element filters have a single layer of metal traces printed onto an insulating substrate backed with a ground plane. Similar to the bars or rods of mechanical filters, these traces form transmission line networks which make up the filter circuit. The length dimensions of these printed traces are one-quarter to one-half of the wave length at the center frequency of the filter. At lower microwave frequencies, these filters are large in size. Another disadvantage to printed distributed filters is that spurious responses that occur at multiples of the center frequency will degrade the performance of the filter in the stop band.

SUMMARY OF THE INVENTION

In accordance with the illustrated preferred embodiment, the present invention provides a thin-film, lumped element filter utilizing spiral inductors and capacitive pi networks. The filter is fabricated from a planar dielectric substrate having a ground plane on one side thereof and two thin-film metal layers and an insulation layer disposed therebetween on the opposite side of the dielectric substrate. The metal and insulation layers are configured to form one or more capacitive pi networks and spiral inductors, which are electrically interconnected to form the filter. The capacitive pi networks and spiral inductors act as lumped, not distributed, elements.

Each capacitive pi network includes two pads of the first metal layer separated by a gap, and an overlying region of the second metal layer overlapping the two pads of the first metal layer. The overlying region is separated from at least one pad by the insulation layer. Each pad provides an electrical connection to the capacitive pi network.

Each spiral inductor includes a first trace of the first metal layer looped into a coil, and a second trace of the first metal layer located adjacent to the first trace. A connecting bridge of the second metal layer contacts the coiled end of the first trace and the second trace while bridging over an intermediate portion of the first trace. The insulation layer insulates the connecting bridge from the intermediate portion of the first trace. Each trace provides an electrical connection to the inductor.

Microwave-frequency filters constructed according to the present invention utilize lumped, not distributed, elements, which alleviates the problems of spurious signals in the stop bands seen in prior art printed filters and allows the construction of filters that are small in size. A major advantage of the present invention over discrete lumped filters is that the circuit elements are fabricated in place rather than assembled, thereby resulting in high reliability and stable operation. By utilizing thin-film fabrication techniques, filters according to the present invention can be fabricated at low cost.

The features and advantages described in the specification are not all inclusive, and particularly, many additional features and advantages will be apparent to one of ordinary skill in the art in view of the drawings, specification and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

BRIEF DESCRIPTION OF THE DRAWINGS

FIG. 10 is a schematic representation of a single-stage low-pass filter in accordance with the present invention.

FIG. 11 is a plan view of a multi-stage low-pass filter in accordance with the present invention.

FIG. 12 is a schematic representation of the low-pass filter of FIG. 11.

DETAILED DESCRIPTION OF THE PREFERRED EMBODIMENT

FIGS. 1 through 12 of the drawings depict various preferred embodiments of the present invention for purposes of illustration only. One skilled in the art will readily recognize from the following discussion that alternative embodiments of the structures and methods illustrated herein may be employed without departing from the principles of the invention described herein. The preferred embodiment of the present invention is a filter that utilizes interconnected thin-film lumped elements, namely spiral inductors and capacitive pi networks. The filter of the present invention includes a planar dielectric substrate with a ground plane on one side and two thin-film metal layers and an insulation layer therebetween on the other side of the dielectric substrate. The metal layers are configured, as described below, to form capacitive pi networks, spiral inductors, and intermediate electrical interconnections.

Figure 1:
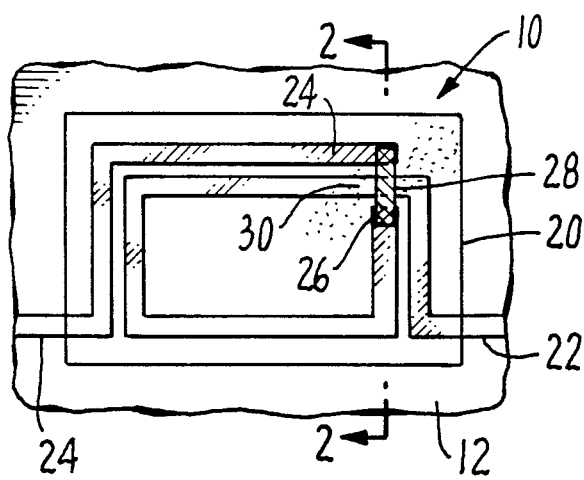
FIG. 1 is a plan view of a thin-film spiral inductor in accordance with the present invention.
Figure 3:
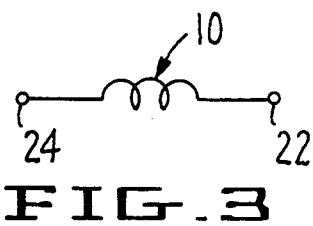
FIG. 3 is a schematic representation of the inductor of FIG. 1.
Figure 2:
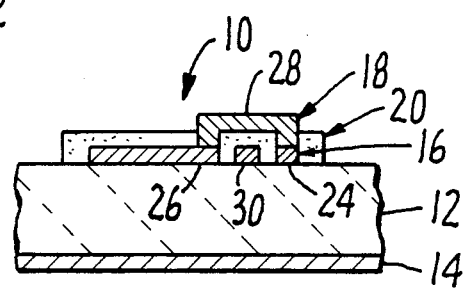
FIG. 2 is a sectional view of the inductor of FIG. 1 and is taken along section line 2—2 of FIG. 1.

A spiral inductor 10 according to the present invention is illustrated in FIGS. 1-3. A dielectric substrate 12 has a metallic ground plane 14 applied to one side and first and second thin-film metal layers 16 and 18, respectively, and an insulation layer 20 applied to the other side, as shown in FIG. 2. The spiral inductor includes two traces 22 and 24 of the first metal layer 16. One trace 22 is looped into a coil and ends at an interior end 26. The other trace 24 runs parallel and adjacent to the periphery of the first trace 22. A connecting bridge 28 is formed by the second metal layer by contacting the interior end 26 of the first trace, bridging over an intermediate portion 30 of the first trace, and contacting the second trace 24. The insulation layer 20 isolates the bridge 28 from the intermediate portion 30 of the coiled trace. The traces 22 and 24 provide electrical connections to the inductor 10. The schematic equivalent of the spiral inductor 10 is shown in FIG. 3.

Figure 4:
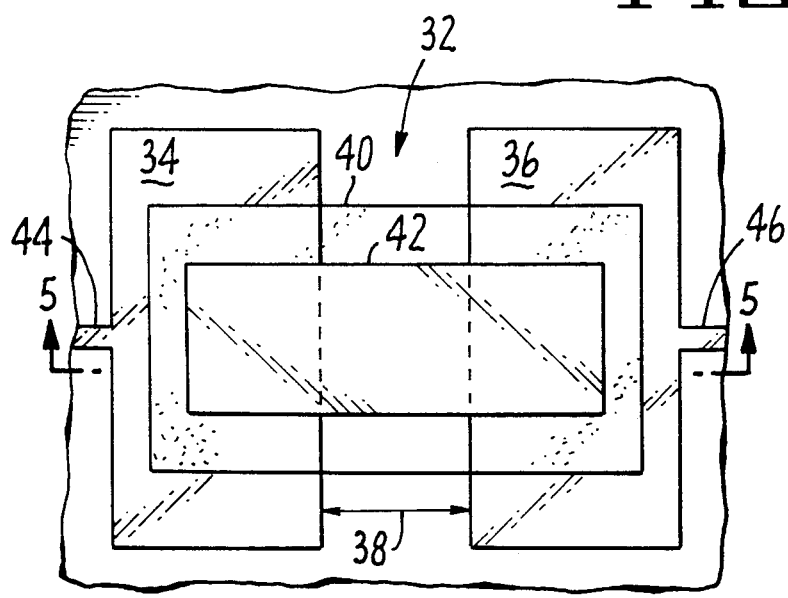
FIG. 4 is a plan view of a thin-film capacitive pi network in accordance with the present invention.
Figure 6:
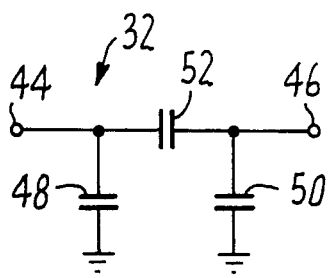
FIG. 6 is a schematic representation of the capacitive pi network of FIG. 4.
Figure 5:
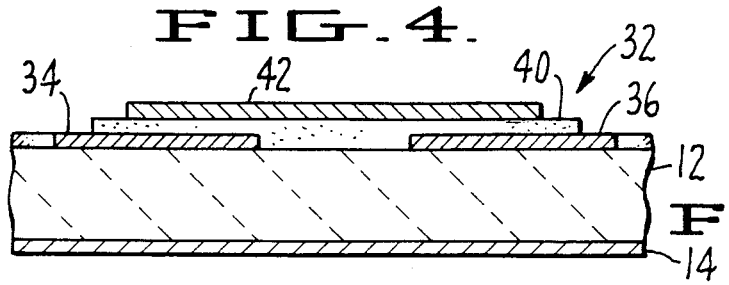
FIG. 5 is a sectional view of the capacitive pi network of FIG. 4 and is taken along section line 5—5 of FIG. 4.

A capacitive pi network 32 according to the present invention is illustrated in FIGS. 4-6. The capacitive pi network 32 includes two pads 34 and 36 of the first metal layer applied to the dielectric substrate 12. The two pads 34 and 36 are separated by a gap 38. On top of at least a portion of the pads 34 and 36 is a region 40 of the insulation layer 20. On top of the insulation region 40 is an overlying region 42 of the second metal layer that overlaps the two pads 34 and 36. The pads 34 and 36 provide electrical connections 44 and 46, respectively, to the capacitive pi network 32.

FIG. 6 illustrates the schematic equivalent of the capacitive pi network 32. One capacitor 48 of the network is formed between pad 34 and the ground plane 14, while another capacitor 50 is formed between pad 36 and the ground plane. The third capacitor 52 actually has three components. One component of capacitor 52 is the capacitance between pads 34 and 36 across the gap 38. In parallel to that are two series capacitances, one formed between pad 34 and region 42 and the other formed between region 42 and pad 36. Either pad 34 or pad 36, but not both, can be in electrical contact with region 42, thereby eliminating one of the two series capacitances.

The traces 22 and 24 of the spiral inductor 10 and the pads 34 and 36 and overlying region 42 of the capacitive pi network 32 are sized to obtain the desired inductance or capacitance. The dielectric substrate 12 is preferably alumina, but other insulating substrates could also be used. The metal layers 14, 16, and 18 are preferably gold or copper and applied by well-known sputtering and patterned by photolithographic methods. Typical thicknesses of the metal layers are in the range of four to ten micrometers. The insulation layer 20 is preferably sprayed polyamide at a thickness of between four to ten micrometers, or vapor deposited silicon nitride at a thickness of about one-half a micrometer. The insulation layer can also be patterned photolithographically to create via holes to the first metal layer 16 where needed, as in the spiral inductor 10. In order to insure that the filter elements act as lumped elements, both the length of each inductor path and the width of the capacitors should be less than one-eighth of the wavelength of the center frequency.

Figure 7:
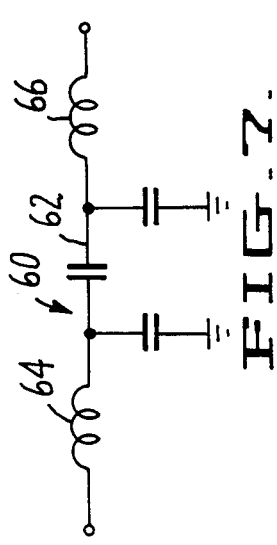
FIG. 7 is a schematic representation of a single-stage bandpass filter in accordance with the present invention.

A single stage bandpass filter 60 of the present invention is shown schematically in FIG. 7. The bandpass filter 60 includes one capacitive pi network 62 plus two spiral inductors 64 and 66, each coupled between the capacitive pi network and an input or output terminal of the filter.

Figure 8:
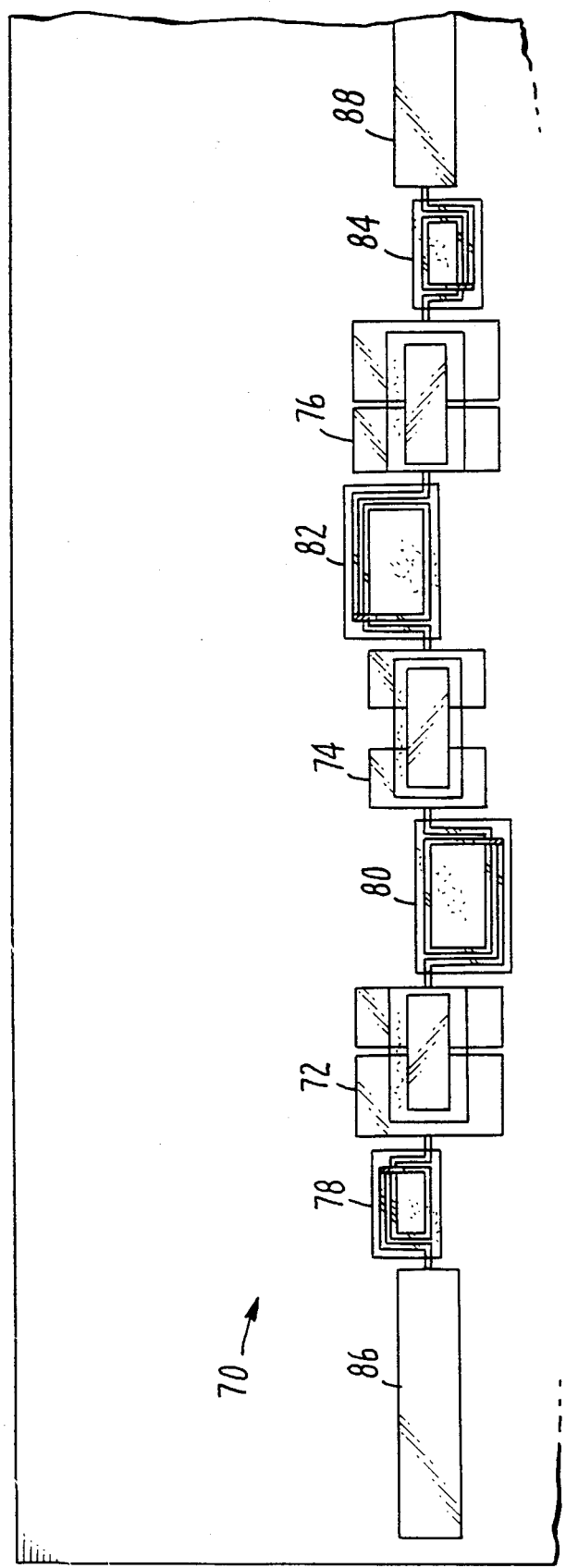
FIG. 8 is a plan view of a multi-stage bandpass filter in accordance with the present invention.
Figure 9:
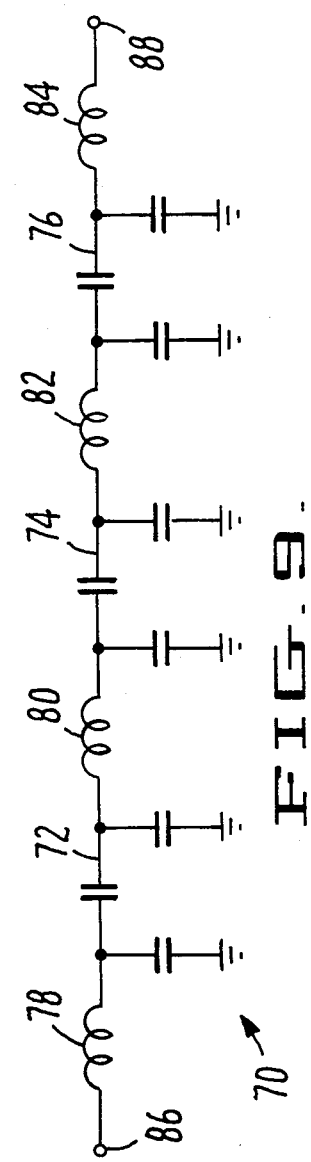
FIG. 9 is a schematic representation of the bandpass filter of FIG. 8.

A multi-stage bandpass filter 70 is shown in FIGS. 8 and 9 to include three capacitive pi networks 72, 74, and 76, and four spiral inductors 78, 80, 82, and 84, all series connected between an input terminal 86 and an output terminal 88. Inductor 78 is coupled between the input terminal 86 of the filter and capacitive pi network 72, while inductor 84 is coupled between the output terminal 88 of the filter and capacitive pi network 76. The remaining inductors and are connected between adjacent capacitive pi networks. Of course, additional stages of inductors and capacitive pi networks could be added.

A single stage elliptic low-pass filter 100 of the present invention is shown schematically in FIG. 10. The low-pass filter 100 includes one capacitive pi network 102 plus three spiral inductors 104, 106, and 108. Inductors 104 and 106 are coupled between the capacitive pi network and an input or output terminal of the filter, while inductor 108 is coupled in parallel with the capacitive pi network 102.

A multi-stage low-pass filter 110 is shown in FIGS. 11 and 12 to include a multi-stage capacitive pi network 112 and eight spiral inductors 114, 116, 118, 120, 122, 124, 126, and 128. The capacitive pi network 112 includes seven pads 130 disposed in a row along the dielectric substrate with gaps in between. Overlying regions 132 overlap each two adjacent pads 130, thus forming a multi-stage capacitive pi network. Inductor 114 is coupled between an input terminal 134 of the filter and capacitive pi network 112, while inductor 128 is coupled between an output terminal 136 of the filter and capacitive pi network 112. The remaining inductors and are connected between adjacent pads 130 of the capacitive pi network. The insulation region 138 is shown as covering all of the first metal layer except portions of the input and output terminals.

From the above description, it will be apparent that the invention disclosed herein provides a novel and advantageous microwave-frequency filter utilizing thin-film lumped elements, including spiral inductors and capacitive pi networks. The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

What is claimed is:

1. A thin-film filter comprising:
   a planar dielectric substrate having a ground plane on one side thereof; and
   first and second thin-film metal layers and an insulation layer therebetween disposed on the side of the dielectric substrate opposite the ground plane and forming one or more electrically interconnected capacitive pi networks and spiral inductors, wherein the capacitive pi networks and inductors are lumped elements;

wherein each capacitive pi network includes two pads of the first metal layer separated by a gap, and includes an overlying region of the second metal layer overlapping the two pads of the first metal layer and separated from at least one pad by the insulation layer, wherein each pad provides an electrical connection to the capacitive pi network; and wherein each spiral inductor includes a first trace of the first metal layer looped into a coil and ending at an interior end, includes a second trace of the first metal layer disposed adjacent to the first trace, and includes a connecting bridge of the second metal layer contacting the interior end of the first trace and the second trace while bridging over an intermediate portion of the first trace and separated therefrom by the insulation layer, wherein each trace provides an electrical connection to the inductor.

2. A filter as recited in claim 1 wherein the overlying region of each capacitive pi network is electrically isolated from both corresponding pads.

3. A filter as recited in claim 1 wherein the overlying region of each capacitive pi network is electrically coupled to one corresponding pad and electrically isolated from the other pad.

4. A filter as recited in claim 1 wherein the second trace of each inductor is disposed parallel to a portion of the first trace of the inductor.

5. A thin-film bandpass filter comprising:
a planar dielectric substrate having a ground plane on one side thereof; and
first and second thin-film metal layers and an insulation layer therebetween disposed on the side of the dielectric substrate opposite the ground plane and forming a capacitive pi network electrically coupled to two spiral inductors, wherein the capacitive pi networks and inductors are lumped elements;
wherein the capacitive pi network includes two pads of the first metal layer separated by a gap and includes an overlying region of the second metal layer overlapping the two pads of the first metal layer and separated from at least one pad by the insulation layer; and
wherein one inductor is coupled between an input port of the filter and one pad of the capacitive pi network and the other inductor is coupled between the other pad of the capacitive pi network and an output port of the filter, wherein each inductor includes a first trace of the first metal layer looped into a coil and ending at an interior end, includes a second trace of the first metal layer disposed adjacent to the first trace, and includes a connecting bridge of the second metal layer contacting the interior end of the first trace and the second trace while bridging over an intermediate portion of the first trace and separated therefrom by the insulation layer, wherein each trace provides an electrical connection between the inductor and either the capacitive pi network or a port of the filter.

6. A thin-film bandpass filter comprising:
a planar dielectric substrate having a plane on one side thereof; and
first and second thin-film metal layers and an insulation layer therebetween disposed on the side of the dielectric substrate opposite the ground plane and forming a plurality of electrically interconnected capacitive pi networks and spiral inductors, wherein the capacitive pi networks and inductors are lumped elements;

wherein each capacitive pi network includes two pads of the first metal layer separated by a gap and includes an overlying region of the second metal layer overlapping the two pads of the first metal layer and separated from at least one pad by the insulation layer, wherein each pad provides an electrical connection to the capacitive pi network; and wherein the spiral inductors number one more than the number of capacitive pi networks, wherein one inductor is coupled between an input port of the filter and one capacitive pi network, another inductor is coupled between another capacitive pi network and an output port of the filter, and each of the remaining inductors is coupled between two capacitive pi networks, wherein each inductor includes a first trace of the first metal layer looped into a coil and ending at an interior end, includes a second trace of the first metal layer disposed adjacent to the first trace, and includes a connecting bridge of the second metal layer contacting the interior end of the first trace and the second trace while bridging over an intermediate portion of the first trace and separated therefrom by the insulation layer, wherein each trace provides an electrical connection between the inductor and either the capacitive pi network or a port of the filter.

7. A thin-film low-pass filter comprising:
a planar dielectric substrate having a ground plane on one side thereof; and
first and second thin-film metal layers and an insulation layer therebetween disposed on the side of the dielectric substrate opposite the ground plane and forming a capacitive pi network electrically coupled to three spiral inductors, wherein the capacitive pi network and inductors are lumped elements;
wherein the capacitive pi network has two pads of the first metal layer separated by a gap and has an overlying region of the second metal layer overlapping the two pads of the first metal layer and separated from at least one pad by the insulation layer; and
wherein one inductor is coupled between an input port of the filter and one pad of the capacitive pi network, another inductor is coupled between the other pad of the capacitive pi network and an output port of the filter, and the remaining inductor is coupled in parallel with the capacitive pi network between the two pads thereof, wherein each inductor includes a first trace of the first metal layer looped into a coil and ending at an interior end, includes a second trace of the first metal layer disposed adjacent to the first trace, and includes a connecting bridge of the second metal layer contacting the interior end of the first trace and the second trace while bridging over an intermediate portion of the first trace and separated therefrom by the insulation layer, wherein each trace provides an electrical connection to the inductor.

8. A thin-film low-pass filter comprising:
a planar dielectric substrate having a ground plane on one side thereof; and first and second thin-film metal layers and an insulation layer therebetween disposed on the side of the dielectric substrate opposite the ground plane and forming a multi-stage capacitive pi network electrically coupled to a plurality of spiral inductors, wherein the capacitive pi networks and inductors are lumped elements;

wherein the multi-stage capacitive pi network includes a plurality of pads of the first metal layer each separated from an adjacent pad by a gap and includes overlying regions of the second metal layer overlapping each two adjacent pads of the first metal layer and separated from at least one pad by the insulation layer; and wherein the number of spiral inductors is one more than the number of pads of the capacitive pi network, wherein one inductor is coupled between an input port of the filter and one pad of the capacitive pi network, another inductor is coupled between the another pad of the capacitive pi network and an output port of the filter, and each of the remaining inductors is coupled between two adjacent pads of the capacitive pi network, wherein each inductor includes a first trace of the first metal layer looped into a coil and ending at an interior end, includes a second trace of the first metal layer disposed adjacent to the first trace, and includes a connecting bridge of the second metal layer contacting the interior end of the first trace and the second trace while bridging over an intermediate portion of the first trace and separated therefrom by the insulation layer, wherein each trace provides an electrical connection to the inductor.

* * * * *

UNITED STATES PATENT AND TRADEMARK OFFICE
CERTIFICATE OF CORRECTION

PATENT NO. : 4,881,050
DATED : November 14, 1989
INVENTOR(S) : Daniel G. Swanson, Jr.

It is certified that error appears in the above-indentified patent and that said Letters Patent is hereby corrected as shown below:

On the Title page, item,

[21] Application No., change "228,288" to -- 228,388 --.

Column 5, line 65, before "plane" insert -- ground --.

Signed and Sealed this

Fifth Day of April, 1994

Attest:

BRUCE LEHMAN

*Attesting Officer*    *Commissioner of Patents and Trademarks*